United States Patent
Ye et al.

(10) Patent No.: US 12,189,884 B2
(45) Date of Patent: Jan. 7, 2025

(54) TOUCHPAD ASSEMBLY

(71) Applicant: TPK Advanced Solutions Inc., Fujian (CN)

(72) Inventors: Cai Jin Ye, Xiamen (CN); Tsai Kuei Wei, Hsinchu County (TW); Wei Yi Lin, Taoyuan (TW); Chen Hsin Chang, Taoyuan (TW); Dong Yi Huang, Taipei (TW)

(73) Assignee: TPK Advanced Solutions Inc., Fujian (CN)

( * ) Notice: Subject to any disclaimer, the term of this patent is extended or adjusted under 35 U.S.C. 154(b) by 0 days.

(21) Appl. No.: 18/509,575

(22) Filed: Nov. 15, 2023

(65) Prior Publication Data

US 2024/0176440 A1 May 30, 2024

(30) Foreign Application Priority Data

Nov. 28, 2022 (CN) .......................... 202211506329.6

(51) Int. Cl.
*G06F 3/041* (2006.01)
*H05K 1/18* (2006.01)

(52) U.S. Cl.
CPC ......... *G06F 3/04144* (2019.05); *H05K 1/181* (2013.01); *H05K 2201/10151* (2013.01); *H05K 2201/10984* (2013.01)

(58) Field of Classification Search
CPC ....... G06F 3/04144; G06F 2203/04105; G06F 3/016; G06F 2203/04103; H05K 1/181; H05K 2201/10151; H05K 2201/10984
See application file for complete search history.

(56) References Cited

U.S. PATENT DOCUMENTS

| | | | |
|---|---|---|---|
| 2016/0327986 A1* | 11/2016 | Farahani | G06F 1/169 |
| 2018/0275810 A1* | 9/2018 | Khoshkava | G06F 3/016 |
| 2022/0091687 A1* | 3/2022 | Choi | G01L 1/205 |
| 2023/0110133 A1* | 4/2023 | Dhar | G06F 3/045 |
| | | | 345/173 |
| 2023/0376083 A1* | 11/2023 | Noh | G06F 3/03547 |

FOREIGN PATENT DOCUMENTS

CN 107025017 B 5/2021

* cited by examiner

*Primary Examiner* — Premal R Patel
(74) *Attorney, Agent, or Firm* — Cooper Legal Group, LLC

(57) ABSTRACT

A touchpad assembly comprises a cover plate, a touch printed circuit board, a force-supporting component, a plurality of vibration isolators, and a plurality of strain gauges. The touch printed circuit board comprises a first region, a second region that surrounds the first region, a first surface, and a second surface, wherein the first surface and the second surface face toward and away from the cover plate respectively. The force-supporting component is disposed between the cover plate and the first surface. The vibration isolators are disposed on the second surface and located in the second region. The Young's modulus of the vibration isolators is in a range of 150 kPa to 800 kPa. The strain gauges are disposed on the touch printed circuit board. Each of the strain gauges extends from the second region to the first region.

20 Claims, 10 Drawing Sheets

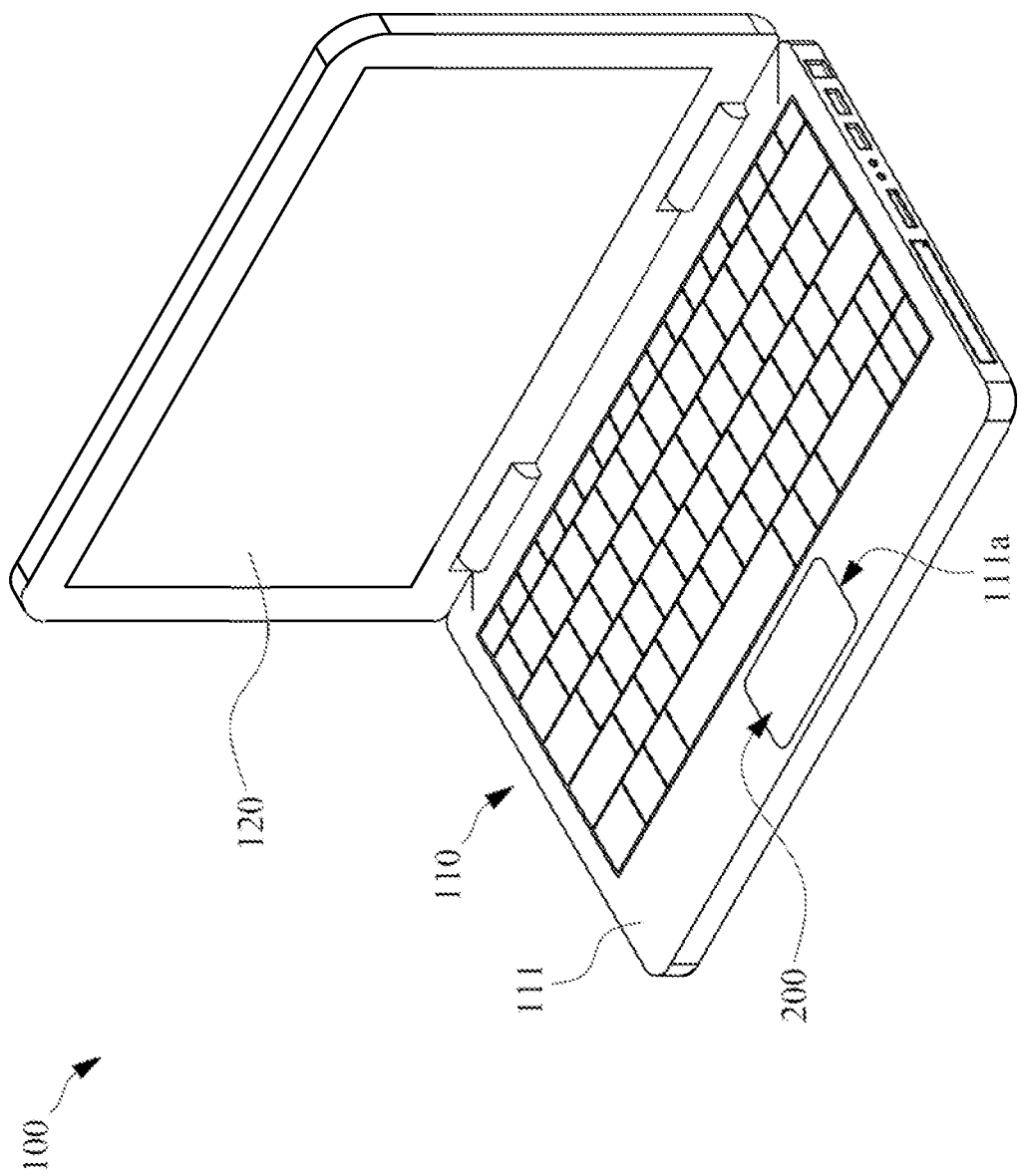

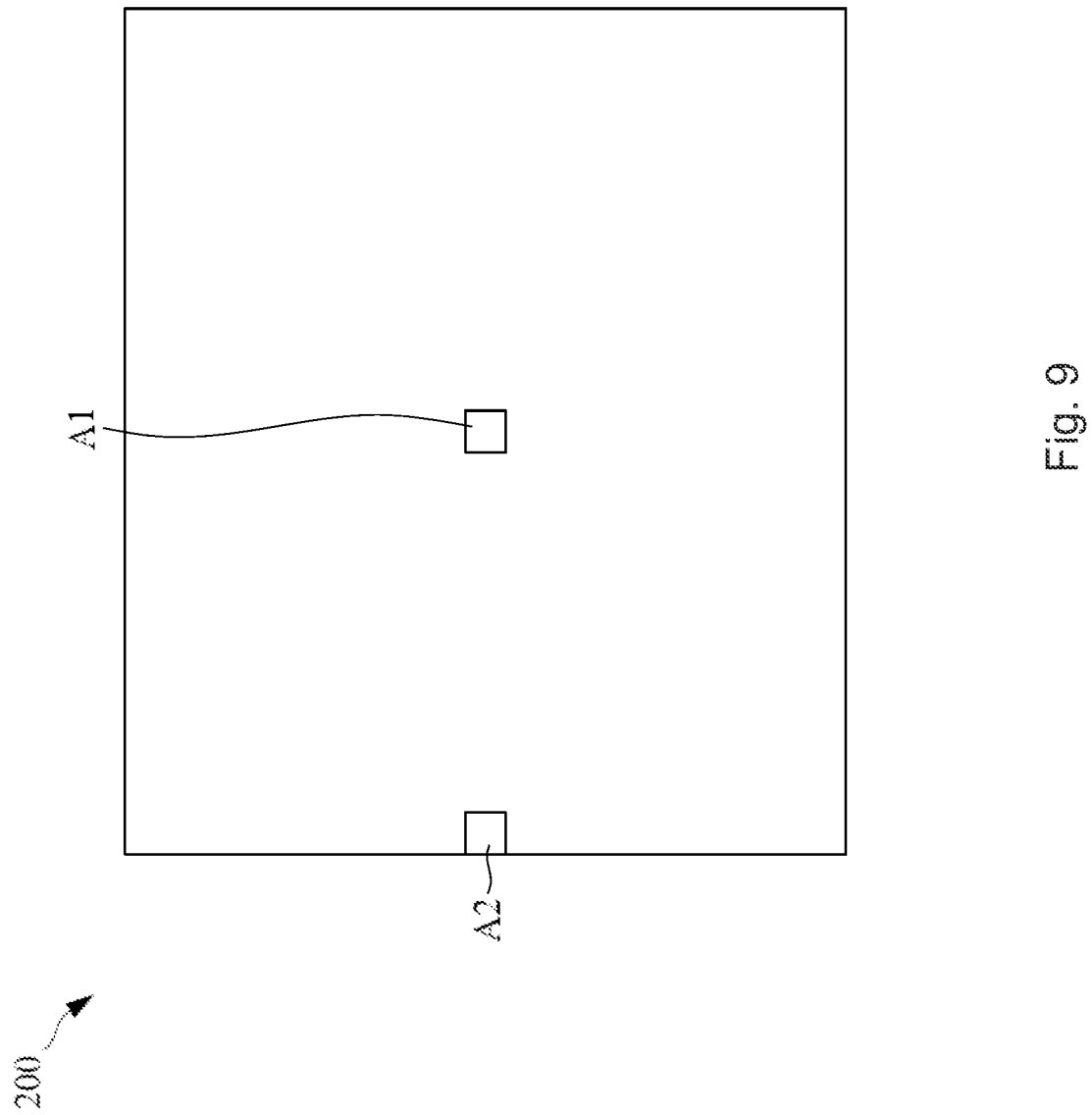

TOUCHPAD ASSEMBLY

CROSS-REFERENCE TO RELATED APPLICATION

The present application claims priority to Chinese Patent Application 202211506329.6, filed on Nov. 28, 2022, which is incorporated herein by reference.

BACKGROUND

Field of Disclosure

The present disclosure relates to a touchpad assembly.

Description of Related Art

The current development trend of touchpad assemblies is the advancement from merely a touch function to an integration of touch, force sensing, and haptic feedback. A touchpad assembly of the prior art installs a force sensor on an elastic component (such as a metal frame) and mounts the elastic component to a touch printed circuit board, for example, those described in China Patent Application No. 107025017B. However, the disadvantages of these assemblies of the prior art include the large amount of elements, complex assembly processes, higher overall costs, and generally greater thickness.

Therefore, the solution to tackle the aforementioned disadvantages of touchpad assemblies is a major focus that the industry desperately needs and will invest its research and development resources in.

SUMMARY

In view of this, an objective of the present disclosure is to provide solutions to the aforementioned problems of touchpad assemblies.

To achieve the aforementioned objective, based on one embodiment of the present disclosure, a touchpad assembly comprises a cover plate, a touch printed circuit board, a force-supporting component, a plurality of vibration isolators, and a plurality of strain gauges. The touch printed circuit board comprises a first region, a second region that surrounds the first region, a first surface, and a second surface, wherein the first surface and the second surface face toward and away from the cover plate respectively. The force-supporting component is disposed between the cover plate and the first surface. The vibration isolators are disposed on the second surface and located in the second region. Young's modulus of the vibration isolators is in a range of 150 kPa to 800 kPa. The strain gauges are disposed on the touch printed circuit board. Each of the strain gauges extends from the second region to the first region.

In one or several embodiments of the present disclosure, Young's modulus of the force-supporting component is in a range of 500 kPa to 2000 MPa.

In one or several embodiments of the present disclosure, the thickness of the touch printed circuit board is in a range of 0.5 mm to 1.0 mm.

In one or several embodiments of the present disclosure, the distance between the cover plate and the first surface of the touch printed circuit board is in a range of 0.1 mm to 0.3 mm.

In one or several embodiments of the present disclosure, the first region is defined by the orthographic projection of the force-supporting component on the touch printed circuit board.

In one or several embodiments of the present disclosure, the distance between the edge of the force-supporting component and the edge of the touch printed circuit board is in a range of 2.0 mm to 4.0 mm.

In one or several embodiments of the present disclosure, the aforementioned edge of the force-supporting component and the aforementioned edge of the touch printed circuit board are located on the same side of the force-supporting component and the touch printed circuit board.

In one or several embodiments of the present disclosure, the orthographic projection of the aforementioned edge of the force-supporting component on the second surface overlaps with one of the strain gauges. One of the vibration isolators is located between the aforementioned strain gauges and the aforementioned edge of the touch printed circuit board.

In one or several embodiments of the present disclosure, the strain gauges are disposed on the second surface.

In one or several embodiments of the present disclosure, the vibration isolators are located between the strain gauges and the outer edge of the touch printed circuit board separately.

In one or several embodiments of the present disclosure, the touchpad assembly further comprises a vibration element, wherein the vibration element is disposed on the second surface and located in the first region.

In one or several embodiments of the present disclosure, the vibration element is a horizontal vibration motor.

In one or several embodiments of the present disclosure, the thickness of the vibration element is smaller than the thickness of the vibration isolators.

In one or several embodiments of the present disclosure, the force-supporting component has a stacked-layer structure.

In one or several embodiments of the present disclosure, the stacked-layer structure comprises two pressure-sensitive adhesive layers and at least one plastic layer located between the two pressure-sensitive adhesive layers.

In one or several embodiments of the present disclosure, the two pressure-sensitive adhesive layers are in touch with the cover plate and the touch printed circuit board respectively.

In one or several embodiments of the present disclosure, materials of the plastic layer include polyethylene terephthalate (PET).

In one or several embodiments of the present disclosure, materials of the force-supporting component include silicone.

In one or several embodiments of the present disclosure, the second region has a circular shape.

In one or several embodiments of the present disclosure, the second region comprises a plurality of separate subregions.

In summary, within the touchpad assembly of the present disclosure, the vibration isolator is disposed on the second surface of the touch printed circuit board that is away from the cover plate and can be a support point for the touchpad assembly to be mounted on an external component (for example, the casing part of an electronic device). The vibration isolator can lift the touch printed circuit board upward, forming a space between the second surface of the touch printed circuit board and the external component; the space is a solution for the touch printed circuit board to cope with and accommodate the downward deformation of the cover plate caused by pressing. The strain gauge, disposed on the touch printed circuit board, then generates force-sensing signals in response to the deformation of the touch printed circuit board. Therefore, the touch printed circuit board itself has the function of a strain gauge arm and the design thereof does not need an additional elastic component (such as a metal frame) that is used in the prior art. Due to the aforementioned design, the touchpad assembly of the present disclosure has advantages including but not limited to fewer elements, simple assembly processes, low overall costs, and generally less thickness.

The aforementioned descriptions are for explaining the problems to be solved, the technological means for solving the problems, and the effect to be achieved by the present disclosure only. Detailed descriptions of the present disclosure are provided as follows with the described embodiments and relevant drawings.

BRIEF DESCRIPTION OF THE DRAWINGS

To better understand the aforementioned and other objectives, novel features, advantages, and the effect of the present disclosure, diagrams are provided as follows.

FIG. 1 is a three-dimensional schematic diagram of an embodiment of the electronic device of the present disclosure;

FIG. 9 is a top view of the touchpad assembly of the present disclosure described in FIG. 1.

DETAILED DESCRIPTION

Figure 2A:
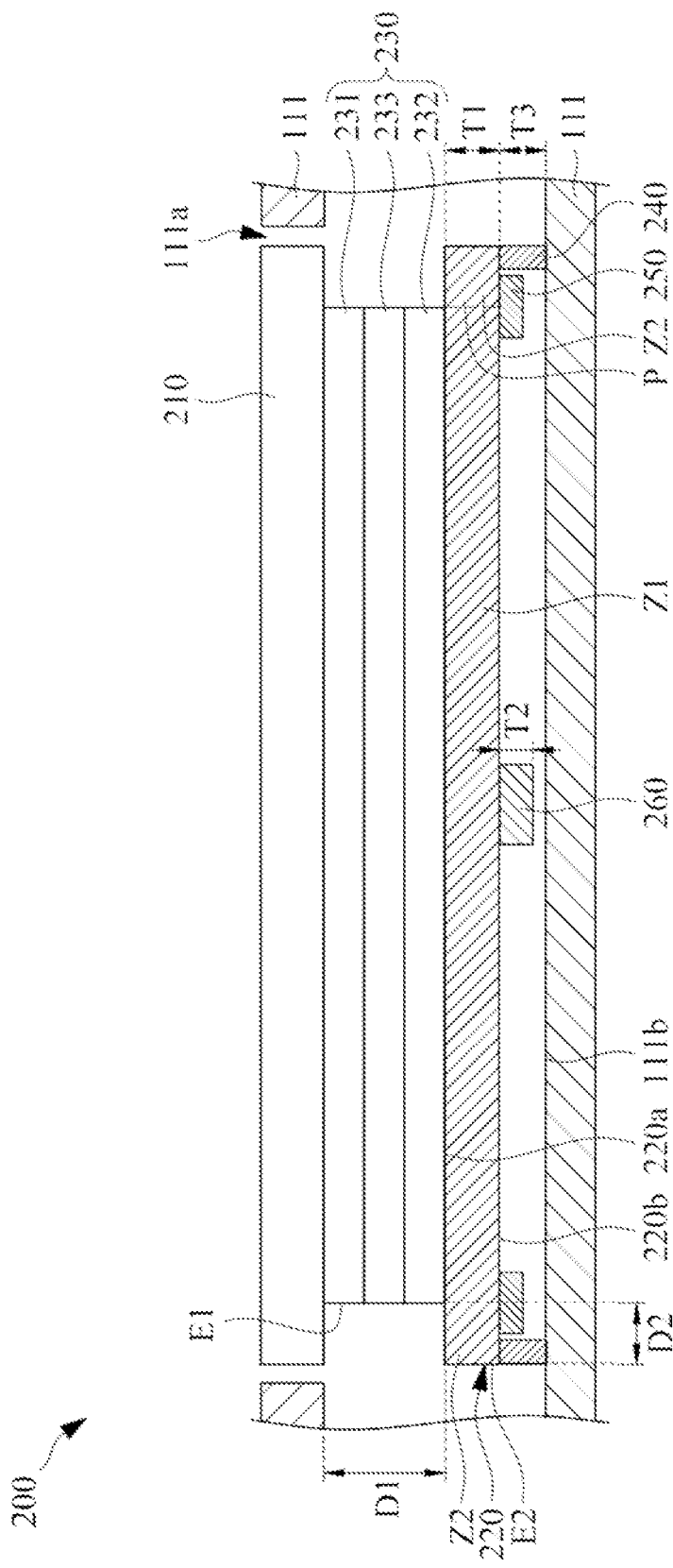
FIG. 2A is a sectional view of the touchpad assembly of the present disclosure described in FIG. 1, wherein the touchpad assembly is in a state without being pressed.

A plurality of embodiments of the present disclosure will be disclosed below with the referencing drawings. For the purpose of clear illustration, many details in practice will be described together with the following descriptions. However, these detailed descriptions in practice are for illustration only and shall not be interpreted to limit the scope, applicability, or configuration of the present disclosure in any way. That is, in some embodiments of the present disclosure, these details in practice are not necessarily required. Furthermore, to simplify the drawings, some structures and components of the prior art shown in the drawings will be illustrated schematically.

Please refer to FIG. 1, which is a three-dimensional schematic diagram of an embodiment of the electronic device 100 of the present disclosure. In the embodiment illustrated in FIG. 1, the electronic device 100 comprises a host computer 110, a monitor 120, and a touchpad assembly 200. The touchpad assembly 200 is disposed in the host computer 110 and is exposed through the opening 111a of the casing part 111 (also known as a cover) of the host computer 110. The touchpad assembly 200 can be an input device that is disposed in the host computer 110 of the present disclosure. However, the present disclosure is not limited thereto. Furthermore, the rectangular area of the touchpad assembly 200 is demarcated by the length and width thereof, wherein the distance between both ends can be adjusted to be wider in response to different machine types (that is, a longer touchpad assembly 200); however, the dimension thereof is not limited to that illustrated in FIG. 1. In practical implementations, the touchpad assembly 200 can also be an electronic device (for example, personal digital assistant, keyboard that includes touchpad, etc.) using the touchpad as an input method or operation interface. In other words, the concept of the touchpad assembly 200 of the present disclosure applies to any electronic device using a touchpad as an input method or operation interface. Detailed descriptions of the structures and functions of some elements of the touchpad assembly 200, and the connections and associated operations among these elements are provided in the following paragraphs.

Figure 2B:
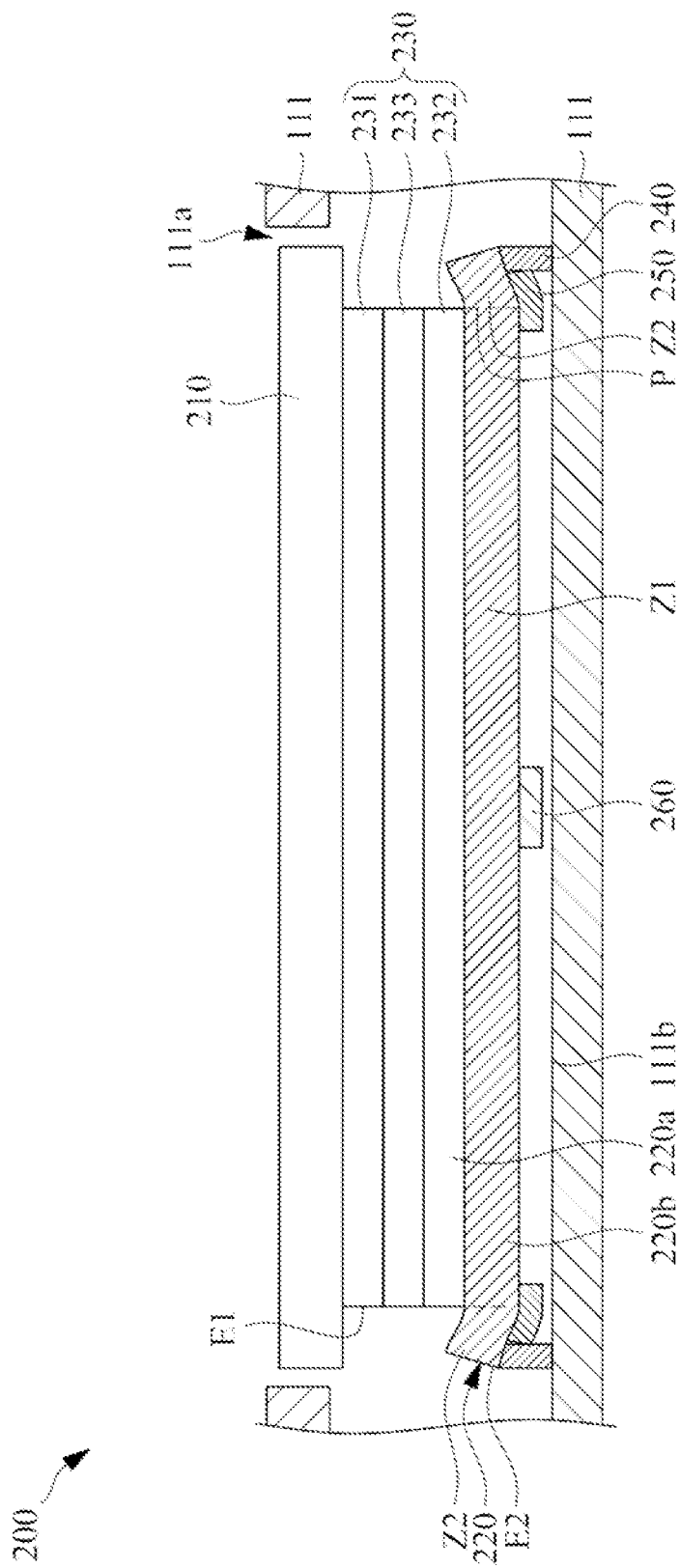
FIG. 2B is another sectional view of the touchpad assembly of the present disclosure described in FIG. 2A, wherein the touchpad assembly is in a state of being pressed.
Figure 3:
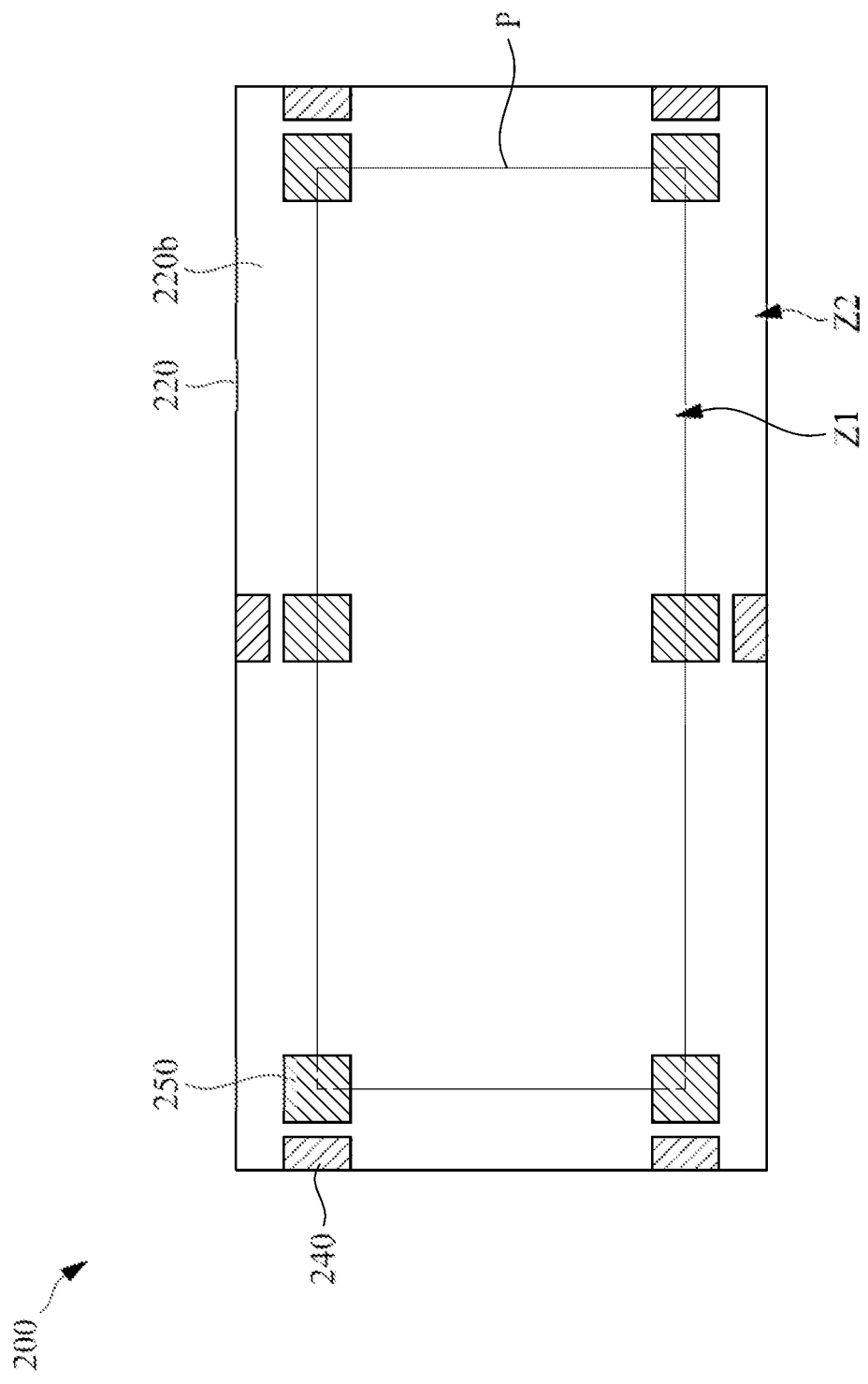
FIG. 3 is a bottom view of an embodiment of the touchpad assembly of the present disclosure.

Please refer to FIG. 2A, FIG. 2B, and FIG. 3. FIG. 2A is a sectional view of the touchpad assembly 200 described in FIG. 1, wherein the touchpad assembly 200 is in a state without being pressed. FIG. 2B is another sectional view of the touchpad assembly 200 described in FIG. 2A, wherein the touchpad assembly 200 is in a state of being pressed. FIG. 3 is a bottom view of the touchpad assembly 200 of an embodiment of the present disclosure. In the embodiments shown in FIG. 2A to FIG. 3, the touchpad assembly 200 comprises a cover plate 210, a touch printed circuit board 220, and a force-supporting component 230. The touch printed circuit board 220 comprises a first region Z1, and a second region Z2 that surrounds the first region Z1, wherein a first surface 220a and a second surface 220b face toward and away from the cover plate 210 respectively. The force-supporting component 230 is disposed between the cover plate 210 and the first surface 220a to support the cover plate 210 to remain above the touch printed circuit board 220. The touch printed circuit board 220 is set to detect the user's touch on the side surface of the cover plate 210 that faces away from the touch printed circuit board 220 and generates touch input signals correspondingly.

In some embodiments, Young's modulus of the force-supporting component 230 is in a range of 500 kPa to 2000 MPa. The force-supporting component 230 has Young's modulus in the aforementioned range and meets the industrial load-bearing specification of 350 grams to 750 grams.

In the embodiment, as shown in FIG. 2A and FIG. 2B, the touchpad assembly 200 further comprises a plurality of vibration isolators 240 and a plurality of strain gauges 250. The vibration isolators 240 are disposed on the second surface 220b of the touch printed circuit board 220 and are located in the second region Z2. The touchpad assembly 200 is mounted onto an inner surface 111b of the casing part 111, which faces toward the touch printed circuit board 220, through the vibration isolators 240. The strain gauges 250 are disposed on the touch printed circuit board 220. In other words, the vibration isolators 240 can lift the touch printed circuit board 220 upward, forming a space between the second surface 220b of the touch printed circuit board 220 and the inner surface 111b of the casing part 111; the space is a solution for the touch printed circuit board 220 to cope with and accommodate the downward deformation of the cover plate 210 caused by pressing. The strain gauges 250, disposed on the touch printed circuit board 220, then generate force-sensing signals in response to the deformation of the touch printed circuit board 220.

Through the aforementioned structural configuration, the touch printed circuit board 220 itself has the function of a strain gauge arm, and the design thereof does not need an additional elastic component (such as a metal frame) that is used in the prior art. Due to the aforementioned design, the touchpad assembly 200 of the embodiment has advantages including but not limited to fewer elements, simple assembly processes, low overall costs, and generally less thickness.

In some embodiments, as shown in FIG. 2A to FIG. 3, the first region Z1 of the touch printed circuit board 220 is defined by the orthographic projection P (the area with boundaries represented by striped lines in FIG. 2A to FIG. 3) of the force-supporting component 230 on the touch printed circuit board 220. In other words, the second region Z2 of the touch printed circuit board 220 corresponds to the region where the touch printed circuit board 220 does not overlap with the orthographic projection P of the force-supporting component 230.

In some embodiments, as shown in FIG. 2A to FIG. 3, each of the strain gauges 250 extends from the second region Z2 to the first region Z1 of the touch printed circuit board 220. The vibration isolators 240 are located between the strain gauges 250 and the outer edge of the touch printed circuit board 220 separately. In other words, the strain gauges 250 are disposed on the second surface 220b. However, the present disclosure is not limited thereto.

For example, as shown in FIG. 2A, the edge E1 of the force-supporting component 230 and the edge E2 of the adjacent touch printed circuit board 220 are located on the same side of the force-supporting component 230 and the touch printed circuit board 220. The orthographic projection of the edge E1 of the force-supporting component 230 on the second surface 220b overlaps with one of the strain gauges 250 in FIG. 2A. One of the vibration isolators 240 on the left side of FIG. 2A is located between one of the strain gauges 250 and the edge E2 of the touch printed circuit board 220.

One thing to be noted is that, since the force-supporting component 230 is disposed on the first surface 220a of the touch printed circuit board 220 and located in the first region Z1, the first region Z1 of the touch printed circuit board 220 is not easily deformed when the cover plate 210 is pressed. In contrast, the location of the touch printed circuit board 220, which has the largest deformation scale when the cover plate 210 is pressed, is at the intersection of the first region Z1 and the second region Z2. Therefore, the strain gauges 250 that extend from the second region Z2 to the first region Z1 can sense and detect the strain of the touch printed circuit board 220 better.

In other embodiments, the strain gauges 250 can also be disposed on the first surface 220a of the touch printed circuit board 220 and located close to the intersection of the first region Z1 and the second region Z2.

In some embodiments, the thickness T1 of the touch printed circuit board 220 is in a range of 0.5 mm to 1.0 mm. One thing to be pointed out is that the touch printed circuit board 220 may become too thin in thickness and may no longer provide sufficient support when the thickness T1 thereof is smaller than 0.5 mm, and in such cases, the deformation thereof can be relatively too large in scale and becomes permanent. Nevertheless, when the thickness T1 is larger than 1.0 mm, the touch printed circuit board 220 is too thick, causing insufficient scale of deformation of the cover plate 210 and resulting in the low sensitivity of detecting force.

In some embodiments, the cover plate 210, the touch printed circuit board 220, and the force-supporting component 230 of the present disclosure are at least part of the capacitive touchpad. However, the present disclosure is not limited thereto.

In some embodiments, the distance D1 between the cover plate 210 and the first surface 220a of the touch printed circuit board 220 is in a range of 0.1 mm to 0.3 mm. When the distance D1 is smaller than 0.1 mm, the cover plate 210 can easily be in contact with the deformed touch printed circuit board 220, which is caused by pressing (for example, the outer edge of the cover plate 210). When the distance D1 is larger than 0.3 mm, the sensitivity of detecting strain becomes low.

In some embodiments, the distance D2 between the edge E1 of the force-supporting component 230 and the edge E2 of the adjacent touch printed circuit board 220 is in a range of 2.0 mm to 4.0 mm. Based on the test records, when the distance D2 is within the aforementioned range, all strain gauges 250 can effectively detect strain of the touch printed circuit board 220.

In the embodiment, as shown in FIG. 2A and FIG. 2B, the touchpad assembly 200 further comprises a vibration element 260. The vibration element 260 is disposed on the second surface 220b and located in the first region Z1 of the touch printed circuit board 220. When the strain gauges 250 generate force sensing signals, the touchpad assembly 200 can generate vibration through the vibration element 260, in order to generate the haptic feedback effect.

In some embodiments, the vibration element 260 can be a horizontal vibration motor that has a higher uniformity of the plane vibration than that of a vertical vibration motor. However, the present disclosure is not limited thereto. In some embodiments, the vibration frequency of the vibration element 260 is in a range of 150 Hz to 190 Hz to generate the haptic feedback effect on users' sense of comfortableness.

In the embodiment, as shown in FIG. 2A and FIG. 2B, the thickness T2 of the vibration element 260 is smaller than the thickness T3 of the vibration isolators 240. The vibration element 260 hereby will not be in contact with the inner surface 111b of the casing part 111.

In some embodiments, Young's modulus of the vibration isolators 240 is in a range of 150 kPa to 800 kPa. The vibration isolates 240 having a Young's modulus in the aforementioned range can effectively reduce the vibration noise and effectively release the vibration stress in the horizontal direction.

In the embodiment, as shown in FIG. 2A and FIG. 2B, the force-supporting component 230 has a stacked-layer structure. The stacked-layer structure comprises two pressure-sensitive adhesive (PSA) layers 231, 232 and a plastic layer 233 that is located between the PSA layers 231, 232. The PSA layers 231 and 232 are in contact with the cover plate 210 and the first surface 220a of the touch printed circuit board 220 respectively. In some embodiments, materials of the plastic layer 233 include, but are not limited to, polyethylene terephthalate (PET). However, the present disclosure is not limited thereto.

In other embodiments, the force-supporting component 230 can have a single-layer structure, and the materials of the force-supporting component 230 include silicone. However, the present disclosure is not limited thereto.

In the embodiment, as shown in FIG. 3, the second region Z2 of the touch printed circuit board 220 has a circular shape. However, the present disclosure is not limited thereto.

Figure 4:
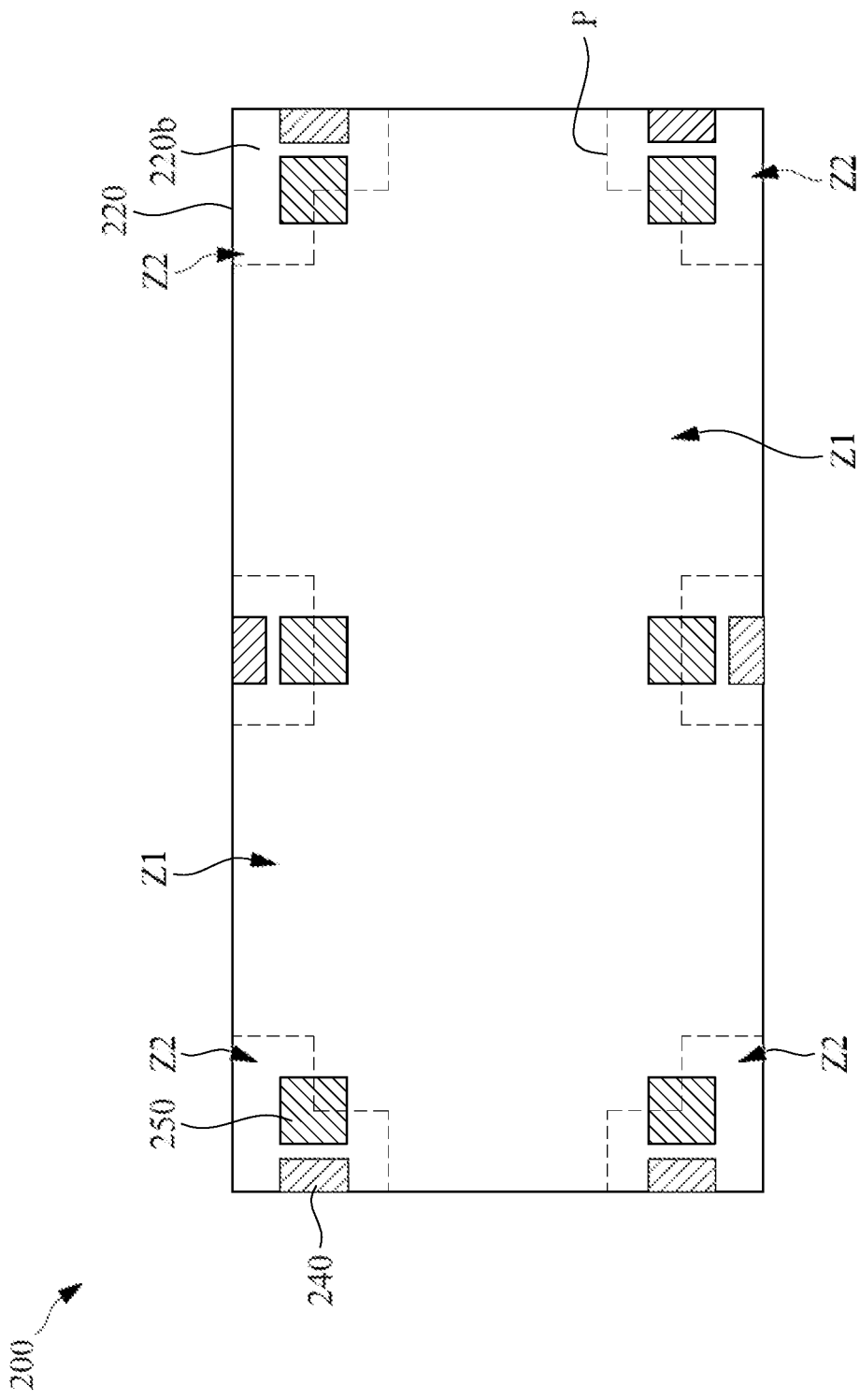
FIG. 4 is a bottom view of another embodiment of the touchpad assembly of the present disclosure.
Figure 5:
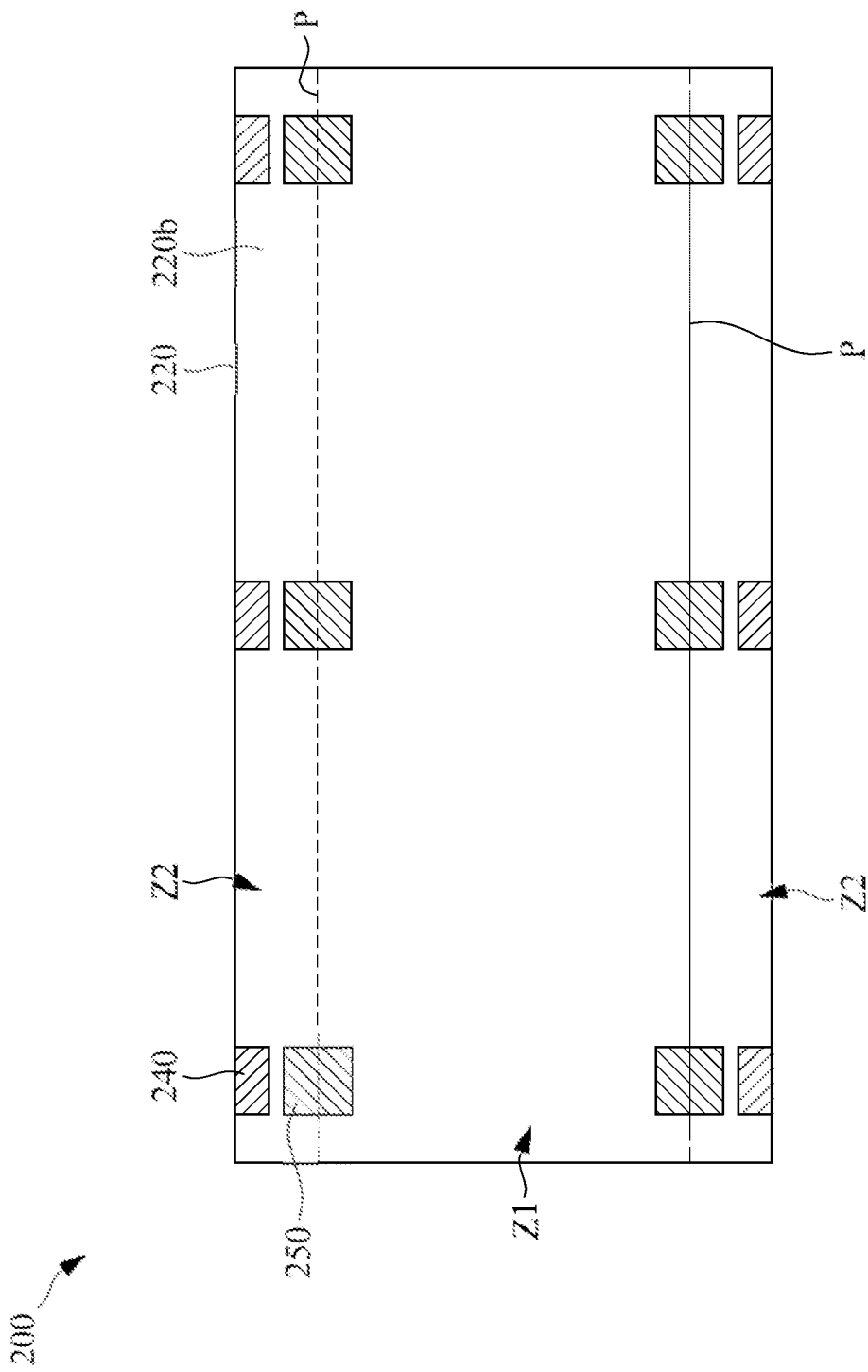
FIG. 5 is a bottom view of another embodiment of the touchpad assembly of the present disclosure.
Figure 6:
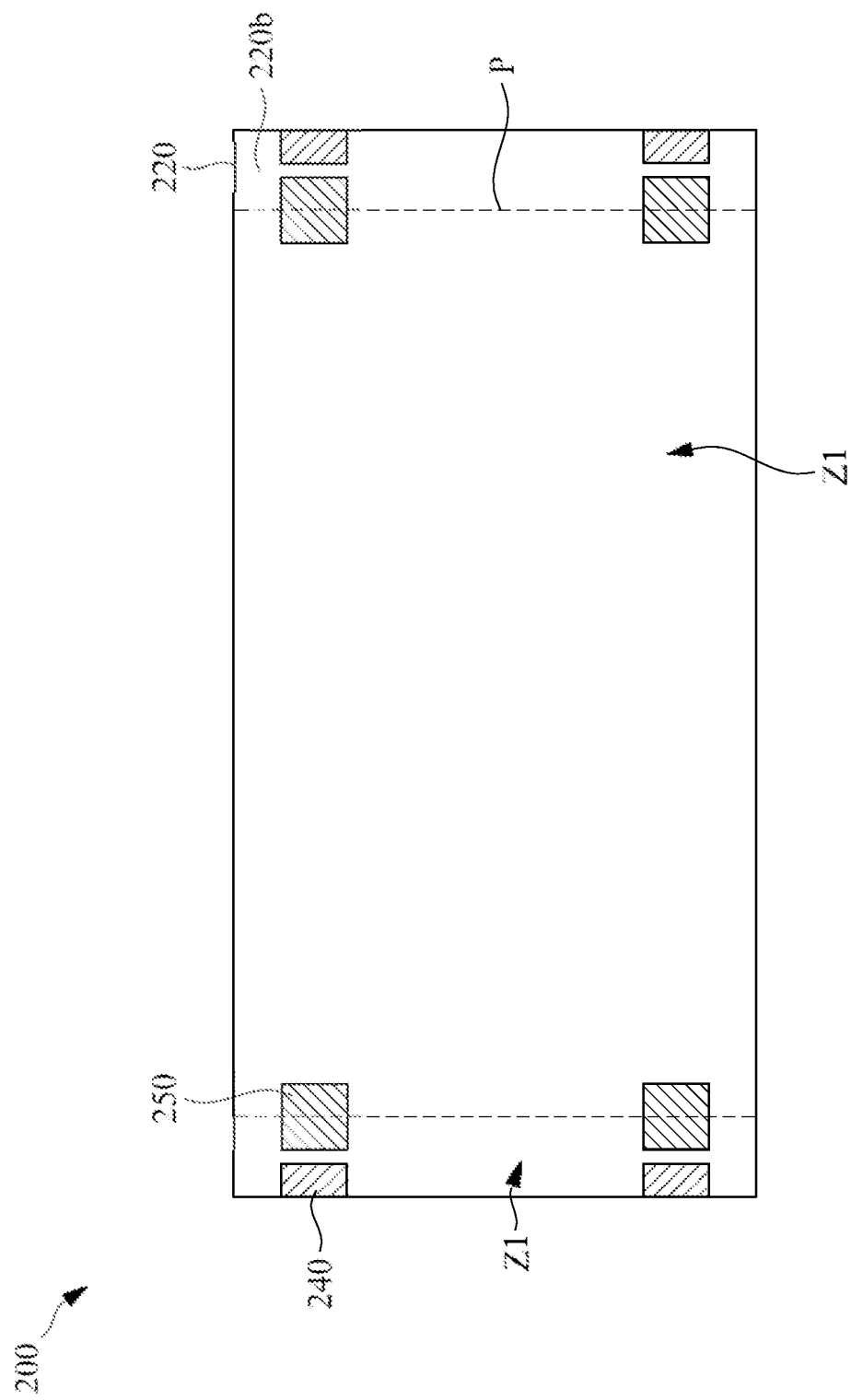
FIG. 6 is a bottom view of another embodiment of the touchpad assembly of the present disclosure.

Please refer to FIG. 4, FIG. 5, and FIG. 6. FIG. 4 to FIG. 6 illustrate the bottom views of the touchpad assembly 200 in different embodiments of the present disclosure respectively. As shown in FIG. 4 to FIG. 6, the second region Z2 of the touch printed circuit board 220 comprises a plurality of separate subregions. More specifically, as shown in FIG. 4, the second region Z2 has six subregions that are located at four different corners, as well as the centers of the upper and lower edges of the touch printed circuit board 220 separately. As illustrated in FIG. 5, the second region Z2 has two subregions that are located on the upper and lower edges of the touch printed circuit board 220 separately. As illustrated in FIG. 6, the second region Z2 has two subregions that are located on the left and right edges of the touch printed circuit board 220 separately. Through designing the distribution locations of the subregions of the second region Z2, locations of the deformed regions of the touch printed circuit board 220 can be controlled effectively when the cover plate 210 is pressed.

Figure 7:
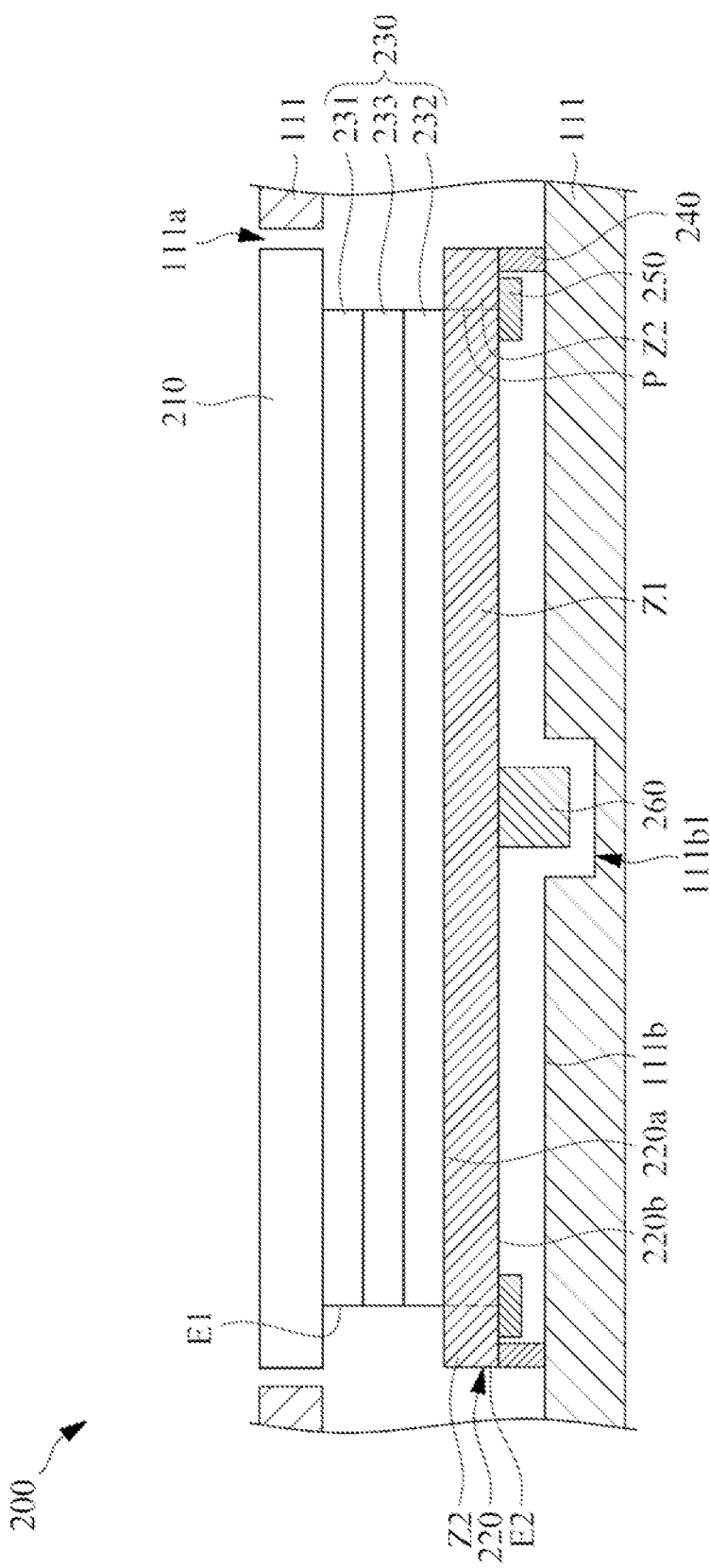
FIG. 7 is a partial sectional view of an electronic device of another embodiment of the present disclosure.

Please refer to FIG. 7, which is a partial sectional view of an electronic device 100 of another embodiment of the present disclosure. In the embodiment, as shown in FIG. 7, the electronic device 100 comprises a casing part 111 and a touchpad assembly 200 that is exposed through the opening 111a of the casing part 111, wherein the touchpad assembly 200 comprises elements that are identical or similar to those of the embodiment illustrated in FIG. 2A. Therefore, relevant explanations can be acquired by referencing the aforementioned descriptions and will not be repeated here. The difference between this embodiment and the other embodiment shown in FIG. 2A is that the casing part 111 of this embodiment has a recessed groove 111b1. The recessed groove 111b1 is formed by the recess of the inner surface 111b and has a space for accommodating a part of the vibration element 260. When the touchpad assembly 200 is pressed, the vibration element 260 will not hit the inner surface 111b. Therefore, not only can the gap between the touch printed circuit board 220 and the inner surface 111b be reduced, thereby decreasing the volume of the electronic device 100, but also the embodiment can use a larger size of vibration element 260 (that is, being freed from the restriction that the thickness T2 of the vibration element 260 must be smaller than the thickness T3 of the vibration isolators 240, as shown in FIG. 2A) to enhance the effect of force feedback.

Figure 8:
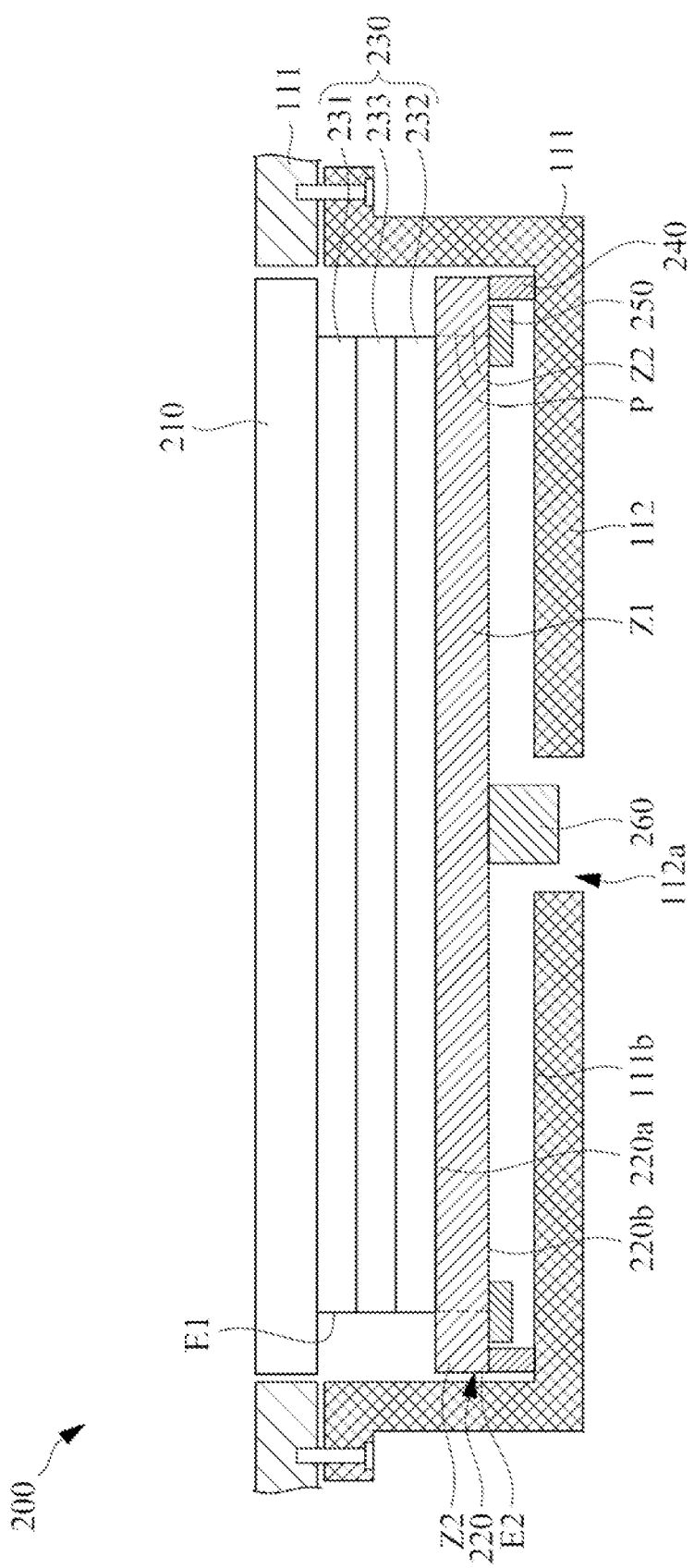
FIG. 8 is a partial sectional view of an electronic device of another embodiment of the present disclosure.

Please refer to FIG. 8, which is a partial sectional view of an electronic device 100 of another embodiment of the present disclosure. In the embodiment shown in FIG. 8, the electronic device 100 comprises a casing part 111 and the touchpad assembly 200 exposed through the opening 111a of the casing part 111, wherein the touchpad assembly 200 comprises elements that are identical or similar to those of the embodiment illustrated in FIG. 2A. Therefore, relevant explanations can be acquired by referencing the aforementioned descriptions and will not be repeated here. The difference between this embodiment and the other embodiment shown in FIG. 2A is that the electronic device 100 of this embodiment further comprises a support frame 112. The support frame 112 is disposed in the host computer 110 (please reference FIG. 1) and mounted to the casing part 111. In some embodiments, the support frame 112 is mounted onto the casing part 111 through screw fastening. However, the present disclosure is not limited thereto. The touchpad assembly 200 is mounted onto the surface of the support frame 112, which faces toward the touch printed circuit board 220, through the vibration isolators 240. Specifically, the support frame 112 has a through-hole 112a. The through-hole 112a is configured for accommodating a part of the vibration element 260. When the touchpad assembly 200 is pressed, the vibration element 260 will not hit the support frame 112. Therefore, not only can the gap between the touch printed circuit board 220 and the surface of the support frame 112 that faces the touch printed circuit board 220 be reduced, thereby decreasing the volume of the electronic device 100, but also the embodiment can use a larger size of vibration element 260 (that is, being freed from the restriction that the thickness T2 of the vibration element 260 must be smaller than the thickness T3 of the vibration isolator 240 as shown in FIG. 2A) to enhance the effect of force feedback.

In some embodiments, materials of the support frame 112 include metals. However, the present disclosure is not limited thereto.

Please refer to FIG. 9, which is a top view of the touchpad assembly 200 described in FIG. 1. As shown in FIG. 9, the force detection sensitivity of the touchpad assembly 200 can be tested by pressing the region A1 located in the center and the region A2 located at the edge. For example, in reference to FIG. 2A and FIG. 9, in embodiment 1, where the distance D2 between the edge E1 of the force-supporting component 230 and the edge E2 of the adjacent touch printed circuit board 220 is 3.0 mm, the values of sensitivity signals, generated by applying the same amount of force to the regions A1 and A2 separately, are 3264 and 2500 respectively. In embodiment 2, where the distance D2 is 4.0 mm, the values of sensitivity signals generated by applying the same amount of force to the regions A1 and A2 separately are 3140 and 2392 respectively. In embodiment 3 where the distance D2 is 5.0 mm, the values of sensitivity signals generated by applying the same amount of force to the regions A1 and A2 separately are 3180 and 1708 respectively. Based on these data, the values of sensitivity signals corresponding to the regions A1 and A2 of embodiments 1 and 2 respectively are relatively close to one another. Therefore, the force detection sensitivity of the touchpad assembly 200 is better.

For example, the following is a physical property table for different materials provided by Taica Corporation.

| MNo. | αGEL | βGEL | θ-7 | θ-5 | θ-6 | θ-5 | NP GEL |
|---|---|---|---|---|---|---|---|
| YYoung's modulus (kPa) | 28.9 | 150.7 | 37.5 | 119.5 | 670.3 | 1432.6 | 269.5 |

Based on the above table, it is shown that materials of models βGEL, θ-6, and NP GEL have a Young's modulus in a range of 150 kPa to 800 kPa, and therefore can be chosen as the materials for producing the vibration isolators 240 to effectively reduce the vibration noise and release the vibration stress in the horizontal direction.

With the aforementioned descriptions of embodiments of the present disclosure, it is apparent that the touchpad assembly of the present disclosure has vibration isolators disposed on the second surface of the touch printed circuit board that faces away from the cover plate, and the vibration isolators can be the support points for the touchpad assembly to be mounted on an external component (the casing part of an electronic device, for example). The vibration isolators can lift the touch printed circuit board upward, forming a space between the second surface of the touch printed circuit board and the external component, which enables the touch printed circuit board to cope with and accommodate the downward deformation of the cover plate caused by pressing. The strain gauges, which are disposed on the touch printed circuit board, then generate force-sensing signals in response to the deformation of the touch printed circuit board. Therefore, the touch printed circuit board itself has the function of a strain gauge arm and the design thereof does not need an additional elastic component used in the prior art. Due to the aforementioned design, the touchpad assembly of the present disclosure has advantages including, but not limited to, fewer elements, simple assembly processes, low overall costs, and generally less thickness.

The aforementioned embodiments are chosen to describe the present disclosure and are not intended to limit the scope of the present disclosure in any way. Alternative embodiments will become apparent to those skilled in the art to which the present disclosure pertains without departing from its spirit and scope. The scope of the present disclosure is defined by the appended claims rather than the foregoing descriptions and the exemplary embodiments described therein.

What is claimed is:

1. A touchpad assembly, comprising:
   a cover plate;
   a touch printed circuit board comprising a first region, a second region that surrounds the first region, a first surface facing toward the cover plate, and a second surface facing away from the cover plate;
   a force-supporting component disposed between the cover plate and the first surface;
   a plurality of vibration isolators disposed on the second surface and located in the second region, wherein Young's modulus of the vibration isolators is in a range of 150 kPa to 800 kPa; and
   a plurality of strain gauges disposed on the touch printed circuit board, wherein each of the strain gauges extends from the second region to the first region.

2. The touchpad assembly of claim 1, wherein the Young's modulus of the force-supporting component is in a range of 500 kPa to 2000 MPa.

3. The touchpad assembly of claim 1, wherein a thickness of the touch printed circuit board is in a range of 0.5 mm to 1.0 mm.

4. The touchpad assembly of claim 1, wherein a distance between the cover plate and the first surface of the touch printed circuit board is in a range of 0.1 mm to 0.3 mm.

5. The touchpad assembly of claim 1, wherein the first region is defined by an orthographic projection of the force-supporting component on the touch printed circuit board.

6. The touchpad assembly of claim 1, wherein a distance between one edge of the force-supporting component and one edge of the touch printed circuit board is in a range of 2.0 mm to 4.0 mm.

7. The touchpad assembly of claim 6, wherein the edge of the force-supporting component and the edge of the touch printed circuit board are located on the same side of the force-supporting component and the touch printed circuit board.

8. The touchpad assembly of claim 6, wherein an orthographic projection of the edge of the force-supporting component on the second surface overlaps with one of the strain gauges; one of the vibration isolators is located between the one of the strain gauges and the edge of the touch printed circuit board.

9. The touchpad assembly of claim 1, wherein the strain gauges are disposed on the second surface.

10. The touchpad assembly of claim 1, wherein the vibration isolators are located between the strain gauges and an outer edge of the touch printed circuit board separately.

11. The touchpad assembly of claim 1, further comprising a vibration element, wherein the vibration element is disposed on the second surface and located in the first region.

12. The touchpad assembly of claim 11, wherein the vibration element is a horizontal vibration motor.

13. The touchpad assembly of claim 11, wherein a thickness of the vibration element is smaller than a thickness of the vibration isolators.

14. The touchpad assembly of claim 1, wherein the force-supporting component has a stacked-layer structure.

15. The touchpad assembly of claim 14, wherein the stacked-layer structure comprises two pressure-sensitive adhesive layers and at least one plastic layer located between the two pressure-sensitive adhesive layers.

16. The touchpad assembly of claim 15, wherein the two pressure-sensitive adhesive layers are in touch with the cover plate and the first surface of the touch printed circuit board respectively.

17. The touchpad assembly of claim 15, wherein materials of the plastic layer comprise polyethylene terephthalate (PET).

18. The touchpad assembly of claim 1, wherein materials of the force-supporting component comprise silicone.

19. The touchpad assembly of claim 1, wherein the second region has a circular shape.

20. The touchpad assembly of claim 1, wherein the second region comprises a plurality of separate subregions.

* * * * *